(12) United States Patent
Yoshioka et al.

(10) Patent No.: US 12,356,692 B2
(45) Date of Patent: Jul. 8, 2025

(54) NITRIDE SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Akira Yoshioka, Yokohama Kanagawa (JP); Toru Sugiyama, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 703 days.

(21) Appl. No.: 17/683,107

(22) Filed: Feb. 28, 2022

(65) Prior Publication Data

US 2023/0091984 A1    Mar. 23, 2023

(30) Foreign Application Priority Data

Sep. 17, 2021    (JP)  ................................. 2021-152133

(51) Int. Cl.
| | |
|---|---|
| *H10D 64/00* | (2025.01) |
| *H01L 23/522* | (2006.01) |
| *H10D 30/47* | (2025.01) |
| *H10D 64/23* | (2025.01) |

(52) U.S. Cl.
CPC ........ *H10D 64/111* (2025.01); *H01L 23/5222* (2013.01); *H01L 23/5228* (2013.01); *H10D 30/475* (2025.01); *H10D 64/251* (2025.01)

(58) Field of Classification Search
CPC .. H10D 64/111; H10D 30/475; H10D 64/251; H10D 62/8503; H01L 23/5222; H01L 23/5228; H01L 23/585
See application file for complete search history.

(56) References Cited

U.S. PATENT DOCUMENTS

| | | | |
|---|---|---|---|
| 8,368,084 B2 | 2/2013 | Keda et al. | |
| 9,691,762 B2 | 6/2017 | Watanabe | |
| 2016/0268410 A1* | 9/2016 | Onizawa | H10D 30/475 |
| 2017/0194477 A1* | 7/2017 | Lin | H01L 23/535 |
| 2017/0200818 A1* | 7/2017 | Suzuki | H10D 30/475 |
| 2018/0350910 A1* | 12/2018 | Saito | H10D 62/405 |
| 2021/0143273 A1* | 5/2021 | Saitoh | H10D 62/8325 |

FOREIGN PATENT DOCUMENTS

| | | |
|---|---|---|
| JP | 2012-256930 A | 12/2012 |
| JP | 5214652 B2 | 6/2013 |
| JP | 6515714 B2 | 5/2019 |

* cited by examiner

*Primary Examiner* — Yasser A Abdelaziz (74) *Attorney, Agent, or Firm* — Kim & Stewart LLP (57) ABSTRACT

A nitride semiconductor device includes a conductive substrate, a nitride semiconductor layer on the substrate, first and second pads disposed above the semiconductor layer and connected to the semiconductor layer, first and second electrodes respectively connected to the first and second pads and extending on the semiconductor layer, a first control electrode extending between the first and second electrodes, and a guard ring disposed on the semiconductor layer, connected to the substrate, and surrounding a region in which the first and second pads, the first and second electrodes and the first control electrode are disposed such that a first capacitor is formed by the guard ring and the first pad and a second capacitor is formed by the guard ring and the second pad.

20 Claims, 9 Drawing Sheets

NITRIDE SEMICONDUCTOR DEVICE

CROSS-REFERENCE TO RELATED APPLICATION(S)

This application is based upon and claims the benefit of priority from No. 2021-152133, filed Sep. 17, 2021, the entire contents of which are incorporated herein by reference.

FIELD

Embodiments described herein relate generally to a nitride semiconductor device.

BACKGROUND

A nitride semiconductor device has recently been developed as a switching device for controlling a current. A nitride semiconductor such as gallium nitride (GaN) is higher in carrier density and electron mobility than silicon (Si) and, therefore, can be used to implement a highly efficient switching device. However, nitride semiconductor devices with improved stability of operations are required.

DETAILED DESCRIPTION

Embodiments provide a nitride semiconductor device having improved stability of operations.

In general, according to one embodiment, a nitride semiconductor device includes a conductive substrate, a nitride semiconductor layer on the substrate, first and second pads disposed above the semiconductor layer and connected to the semiconductor layer, first and second electrodes respectively connected to the first and second pads and extending on the semiconductor layer, a first control electrode extending between the first and second electrodes, and a guard ring disposed on the semiconductor layer, connected to the substrate, and surrounding a region in which the first and second pads, the first and second electrodes and the first control electrode are disposed such that a first capacitor is formed by the guard ring and the first pad and a second capacitor is formed by the guard ring and the second pad.

First Embodiment

Figure 1:
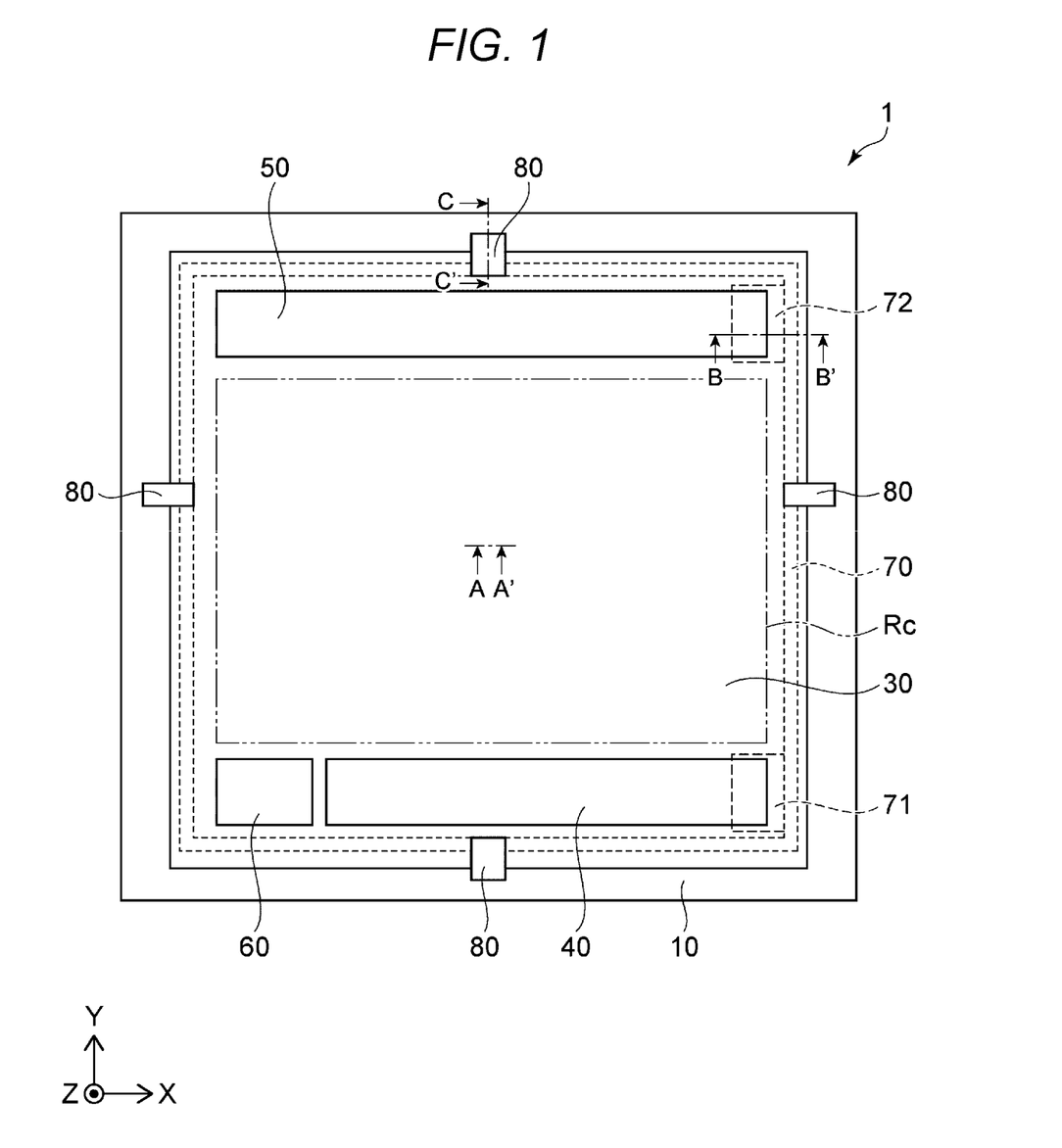
FIG. 1 is a plan view illustrating a nitride semiconductor device according to a first embodiment.
Figure 2A:
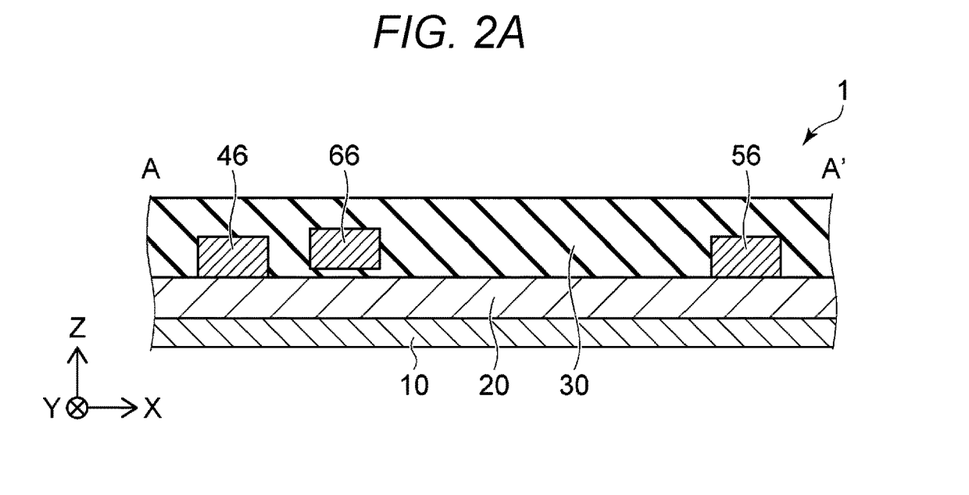
FIG. 2A is a cross-sectional view taken along line A-A' illustrated in FIG. 1.
Figure 2B:
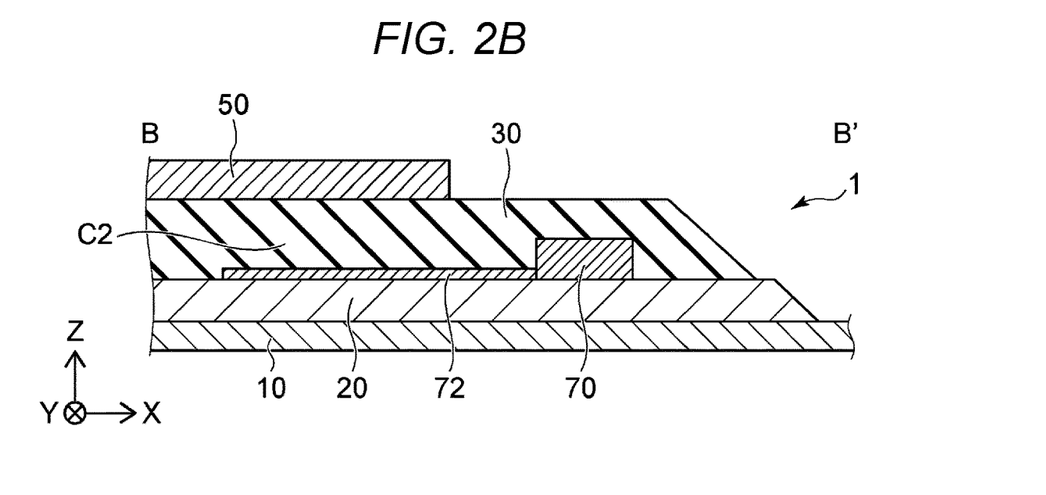
FIG. 2B is a cross-sectional view taken along line B-B' illustrated in FIG. 1.
Figure 2C:
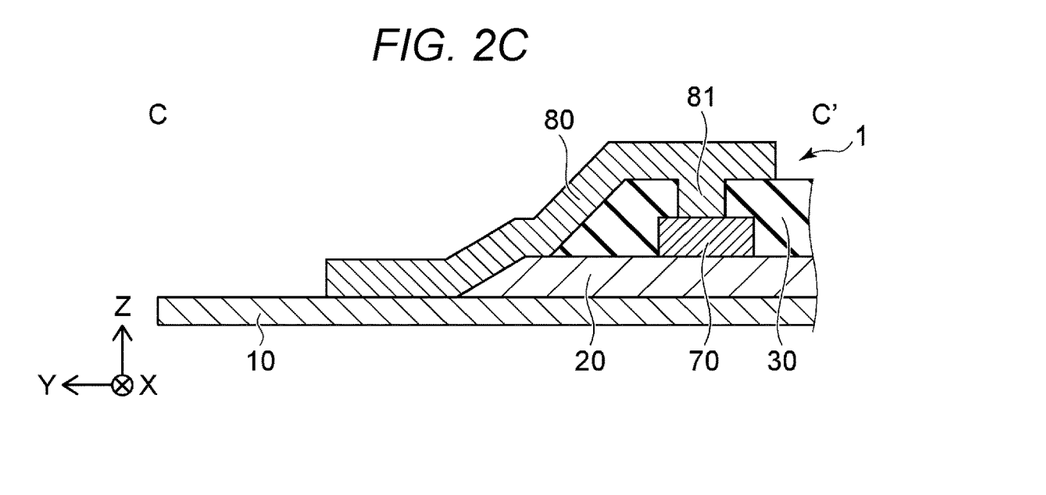
FIG. 2C is a cross-sectional view taken along line C-C' illustrated in FIG. 1.

FIG. 1 is a plan view illustrating a nitride semiconductor device 1 according to a first embodiment. FIG. 2A is a cross-sectional view taken along line A-A' illustrated in FIG. 1, FIG. 2B is a cross-sectional view taken along line B-B' illustrated in FIG. 1, and FIG. 2C is a cross-sectional view taken along line C-C' illustrated in FIG. 1. The nitride semiconductor device 1 according to the present embodiment is, for example, a current control switching device such as a one-way switch.

As illustrated in FIGS. 1 and 2A to 2C, the nitride semiconductor device 1 includes a substrate 10, a nitride semiconductor layer 20, an insulating film 30, a source pad 40, a drain pad 50, a gate pad 60, a plurality of source electrodes 46, a plurality of drain electrodes 56, a plurality of gate electrodes 66, a guard ring 70, a first capacitive electrode 71, a second capacitive electrode 72, an interconnection 80, and a via 81.

The shape of the substrate 10 is, for example, a rectangular plate shape. The substrate 10 is disposed over the entire nitride semiconductor device 1 as viewed from above. The substrate 10 is conductive and formed from, for example, single-crystal silicon.

In the present specification, an XYZ orthogonal coordinate system is adopted for the sake of convenience of description. Two directions parallel to a principal surface of the substrate 10 and orthogonal to each other are defined as an "X direction" and a "Y direction" and a direction perpendicular to the principal surface of the substrate 10 is defined as a "Z direction." While the direction from the substrate 10 to the nitride semiconductor layer 20 along the Z direction may be referred to as an "upward direction" and the direction opposite to the upward direction may be referred to as a "downward direction," these expressions are given for the sake of descriptive convenience and no relationship to the direction of gravity is implied or required.

The nitride semiconductor layer 20 is disposed on the substrate 10 and comes in contact with the substrate 10. The nitride semiconductor layer 20 is formed from, for example, gallium nitride (GaN) or aluminum gallium nitride (AlGaN). An AlGaN layer can be stacked on a GaN layer in the nitride semiconductor layer 20. In such a case, the nitride semiconductor layer 20 contains gallium (Ga), aluminum (Al), and nitrogen (N).

As viewed from above, the outer edge of the nitride semiconductor layer 20 is located on the inner side of the outer edge of the substrate 10. Therefore, the outer peripheral portion of the substrate 10 is not covered with the nitride semiconductor layer 20. In other words, the region immediately above the outer peripheral portion of the substrate 10 is an opening in the nitride semiconductor layer 20. As viewed from above, this opening surrounds the nitride semiconductor layer 20.

The insulating film 30 is disposed on the nitride semiconductor layer 20 and substantially covers the entire nitride semiconductor layer 20. The insulating film 30 is formed from an insulating material formed from silicon nitride (SiN) in this example. The source pad 40, the drain pad 50, the gate pad 60, and the interconnection 80 are disposed on the insulating film 30.

As illustrated in FIG. 1, a cell region Rc is set in the central portion of the nitride semiconductor device 1 as viewed from above. The cell region Rc is an active area through which source/drain currents are fed. The source pad 40, the drain pad 50, the gate pad 60, and the interconnection 80 are disposed outside of the cell region Rc.

In the example illustrated in FIG. 1, the source pad 40 and the gate pad 60 are disposed on one side of the cell region Rc in the Y direction, and the drain pad 50 is disposed on the other side. The source pad 40 and the gate pad 60 are arranged in the X direction.

For example, four interconnections 80 are provided and disposed on both sides of the cell region Rc in the X direction and both sides of the cell region Rc in the Y direction. Each interconnection 80 is disposed in such a manner as to extend beyond the stepped portions formed by the insulating film 30 and the nitride semiconductor layer 20 from the upper surface of the insulating film 30 to the upper surface of the substrate 10. However, a planar layout of each pad and the interconnections 80 is not limited to the example illustrated in FIG. 1. For example, the gate pad 60 may be disposed side by side with the drain pad 50. Furthermore, the number of interconnections 80 is not limited to four and may be equal to or smaller than three or equal to or greater than five. When the plurality of interconnections 80 are provided, the widths of the interconnections 80 may be either identical or different.

As illustrated in FIGS. 1 and 2A to 2C, the source electrode 46, the drain electrode 56, the gate electrode 66, the guard ring 70, the first capacitive electrode 71, and the second capacitive electrode 72 are disposed on or above the nitride semiconductor layer 20 and covered with the insulating film 30. The source electrode 46 is connected to the source pad 40, the drain electrode 56 is connected to the drain pad 50, and the gate electrode 66 is connected to the gate pad 60. It is noted that "connection" or "connected" means an "electrical connection" or being "electrically connected" in the present specification.

The plurality of source electrodes 46, drain electrodes 56, and gate electrodes 66 are disposed inside the cell region Rc. The shapes of the source electrodes 46, the drain electrodes 56, and the gate electrodes 66 are, for example, line shapes extending along the Y direction. In the cell region Rc, the source electrodes 46 and the drain electrodes 56 are arranged alternately, and one gate electrode 66 is disposed between the source electrode 46 and the drain electrode 56 adjacent to each other as viewed from above.

As illustrated in FIG. 2A, each source electrode 46 and each drain electrode 56 come in contact with the upper surface of the nitride semiconductor layer 20 and are connected to the nitride semiconductor layer 20. Each gate electrode 66 is spaced apart from the nitride semiconductor layer 20 in the insulating film 30. The gate electrode 66 is disposed closer to the source electrode 46. That is, the distance between the source electrode 46 and the gate electrode 66 is smaller than the distance between the drain electrode 56 and the gate electrode 66.

As illustrated in FIGS. 1 and 2B, the guard ring 70, the first capacitive electrode 71, and the second capacitive electrode 72 are disposed outside of the cell region Rc. In this example, one guard ring 70, one first capacitive electrode 71, and one second capacitive electrodes 72 are provided. The guard ring 70, the first capacitive electrode 71, and the second capacitive electrode 72 may be either in contact with the nitride semiconductor layer 20 or spaced apart from the nitride semiconductor layer 20 in the insulating film 30.

As viewed from above, the shape of the guard ring 70 is a frame shape, and the guard ring 70 surrounds the cell region Rc and the regions containing the source pad 40, the drain pad 50, and the gate pad 60. The first capacitive electrode 71 and the second capacitive electrode 72 are connected to the guard ring 70 and extend inward of the guard ring 70 from the guard ring 70.

The shape of the first capacitive electrode 71 is, for example, a plate shape. The first capacitive electrode 71 is disposed on the nitride semiconductor layer 20 and immediately below the source pad 40. As viewed from above, a part of the source pad 40 overlaps a part of the first capacitive electrode 71. The part of the source pad 40 is thereby opposed to the part of the first capacitive electrode 71 via the insulating film 30, and a first capacitor C1 is formed between the source pad 40 and the first capacitive electrode 71.

Likewise, the shape of the second capacitive electrode 72 is, for example, a plate shape. The second capacitive electrode 72 is disposed on the nitride semiconductor layer 20 and immediately below the drain pad 50. As viewed from above, a part of the drain pad 50 overlaps a part of the second capacitive electrode 72. The part of the drain pad 50 is thereby opposed to the part of the second capacitive electrode 72 via the insulating film 30, and a second capacitor C2 is formed between the drain pad 50 and the second capacitive electrode 72.

Preferably, a capacitance of the first capacitor C1 is equal to a capacitance of the second capacitor C2. It is noted that "equal" refers to equal at design time. For example, even with differences due to manufacturing process errors or differences due to parasitic capacitances between the first capacitor C1 and the second capacitor C2 and surrounding conductive members, the first capacitor C1 and the second capacitor C2 are considered to be "equal" when being equal in design value.

As illustrated in FIG. 2C, one end portion of each interconnection 80 is disposed on the insulating film 30, and the via 81 is disposed in the insulating film 30. The one end portion of the interconnection 80 is connected to the guard ring 70 through the via 81. The other end portion of the interconnection 80 is disposed on the outer peripheral portion of the substrate 10, that is, in the opening in the nitride semiconductor layer 20 and connected to the substrate 10. The guard ring 70 is thereby connected to the substrate 10 through the via 81 and the interconnection 80. The via 81 and the interconnection 80 form a connection member that connects the guard ring 70 to the substrate 10.

Figure 3:
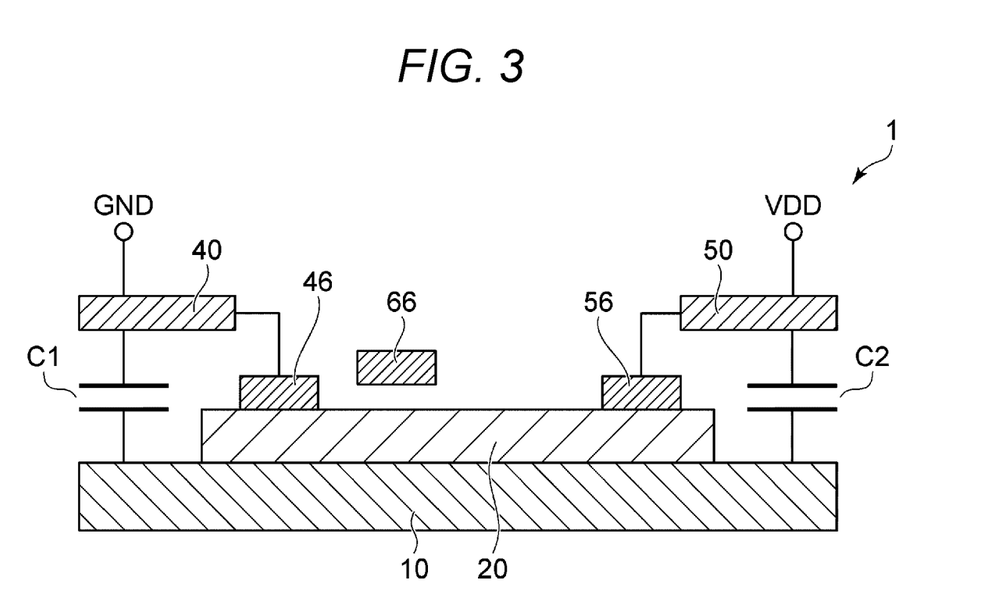
FIG. 3 is a schematic diagram illustrating connection relationships among elements in a nitride semiconductor device according to a first embodiment.

The operations of the nitride semiconductor device 1 will next be described. FIG. 3 is a schematic diagram illustrating connection relationships among the elements in the nitride semiconductor device 1.

As illustrated in FIG. 1, the first capacitor C1 is formed between the source pad 40 and the first capacitive electrode 71 in the nitride semiconductor device 1. The source pad 40 is connected to the source electrode 46, while the first capacitive electrode 71 is connected to the substrate 10 via the guard ring 70, the via 81, and the interconnection 80. Owing to this, as illustrated in FIG. 3, the first capacitor C1 is formed between the source electrode 46 and the substrate 10.

Likewise, as illustrated in FIGS. 1 and 2B, the second capacitor C2 is formed between the drain pad 50 and the second capacitive electrode 72 in the nitride semiconductor device 1. The drain pad 50 is connected to the drain electrode 56, while the second capacitive electrode 72 is connected to the substrate 10 via the guard ring 70, the via 81, and the interconnection 80. Owing to this, as illustrated in FIG. 3, the second capacitor C2 is formed between the drain electrode 56 and the substrate 10.

In this way, the substrate 10 is capacitively coupled to the source electrode 46 via the first capacitor C1 and capacitively coupled to the drain electrode 56 via the second capacitor C2. A potential of the substrate 10 is thereby an intermediate potential between a potential of the source electrode 46 and a potential of the drain electrode 56. For example, as illustrated in FIG. 3, when the capacitance of the first capacitor C1 is equal to the capacitance of the second capacitor C2, a ground voltage GND is applied to the source pad 40, and a power supply voltage VDD is applied to the drain pad 50, the potential of the substrate 10 is approximately (VDD/2). In addition, when the potentials of the source electrode 46 and the drain electrode 56 vary, the potential of the substrate 10 varies to follow the potentials of the source electrode 46 and the drain electrode 56.

Certain effects of the present embodiment will next be described.

According to the present embodiment, the potential of the substrate 10 can be an intermediate potential between the potential of the source electrode 46 and the potential of the drain electrode 56. It is thereby possible to stabilize the potential of the substrate 10 and thus stabilize operations of the nitride semiconductor device 1.

Furthermore, it is possible to reduce electric field concentration and disperse the electric field intensity in the nitride semiconductor layer 20. As a result, it is possible to improve the breakdown voltage of the nitride semiconductor device 1. At this time, setting the capacitance of the first capacitor C1 equal to the capacitance of the second capacitor C2 makes it possible to set the potential difference between the substrate 10 and the source electrode 46 to be substantially equal to the potential difference between the substrate 10 and the drain electrode 56. This can disperse the electric field intensity more effectively.

If the substrate 10 is set into a floating state without providing the first capacitor C1 and the second capacitor C2, then the potential of the substrate 10 is displaced over time in proportion to the operations of the nitride semiconductor device 1, and the operations of the nitride semiconductor device 1 are possibly made unstable as a result. If the ground voltage GND is applied to the substrate 10, the potential of the substrate 10 is made stable. However, then electric field concentration occurs in a portion of the device located between the substrate 10 and each drain electrode 56 in the nitride semiconductor layer 20, and the breakdown voltage possibly decreases. To maintain the breakdown voltage, there is no avoiding making the nitride semiconductor layer 20 thicker, resulting in cost increases.

Second Embodiment

Figure 4:
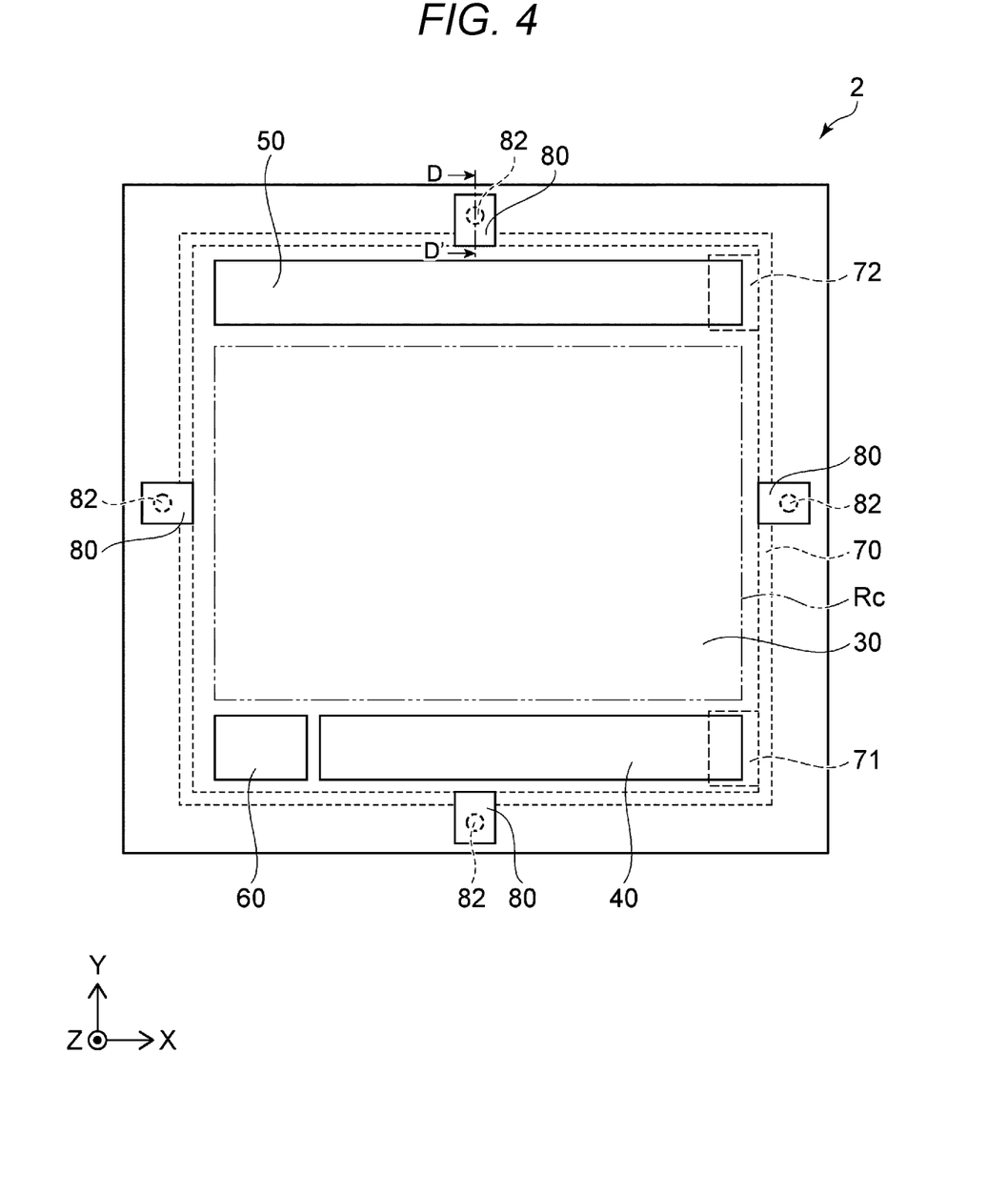
FIG. 4 is a plan view illustrating a nitride semiconductor device according to a second embodiment.
Figure 5:
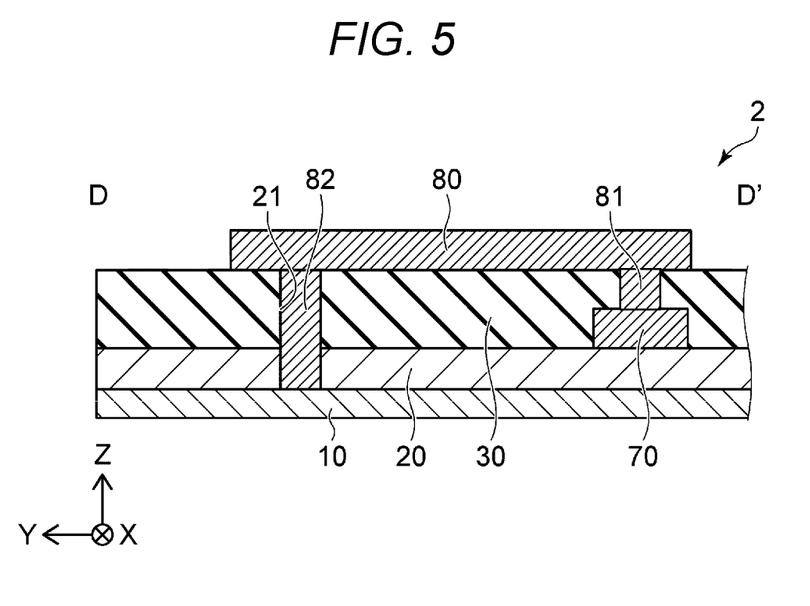
FIG. 5 is a cross-sectional view taken along line D-D' illustrated in FIG. 4.

FIG. 4 is a plan view illustrating a nitride semiconductor device 2 according to a second embodiment. FIG. 5 is a cross-sectional view taken along line D-D' illustrated in FIG. 4.

As illustrated in FIGS. 4 and 5, in the nitride semiconductor device 2 according to the second embodiment, the outer edge of the insulating film 30 and the outer edge of the nitride semiconductor layer 20 substantially coincide with the outer edge of the substrate 10, and an outer peripheral portion of the nitride semiconductor layer 20 is not exposed as viewed from above.

Through-holes 21 are formed in the insulating film 30 and the nitride semiconductor layer 20. A portion of each through-hole 21 that is located in the nitride semiconductor layer 20 is an opening in the nitride semiconductor layer 20. A via 82 is formed in each through-hole 21. The lower end of the via 82 is connected to the substrate 10, and the upper end of the via 82 is connected to each interconnection 80.

The guard ring 70 is thereby connected to the substrate 10 via the via 81, the interconnection 80, and the via 82. In the present embodiment, the via 81, the interconnection 80, and the via 82 form the connection member that connects the guard ring 70 to the substrate 10.

Configurations other than those described above, operations, and effects according to the second embodiment are similar to those according to the first embodiment unless otherwise noted.

Third Embodiment

Figure 6:
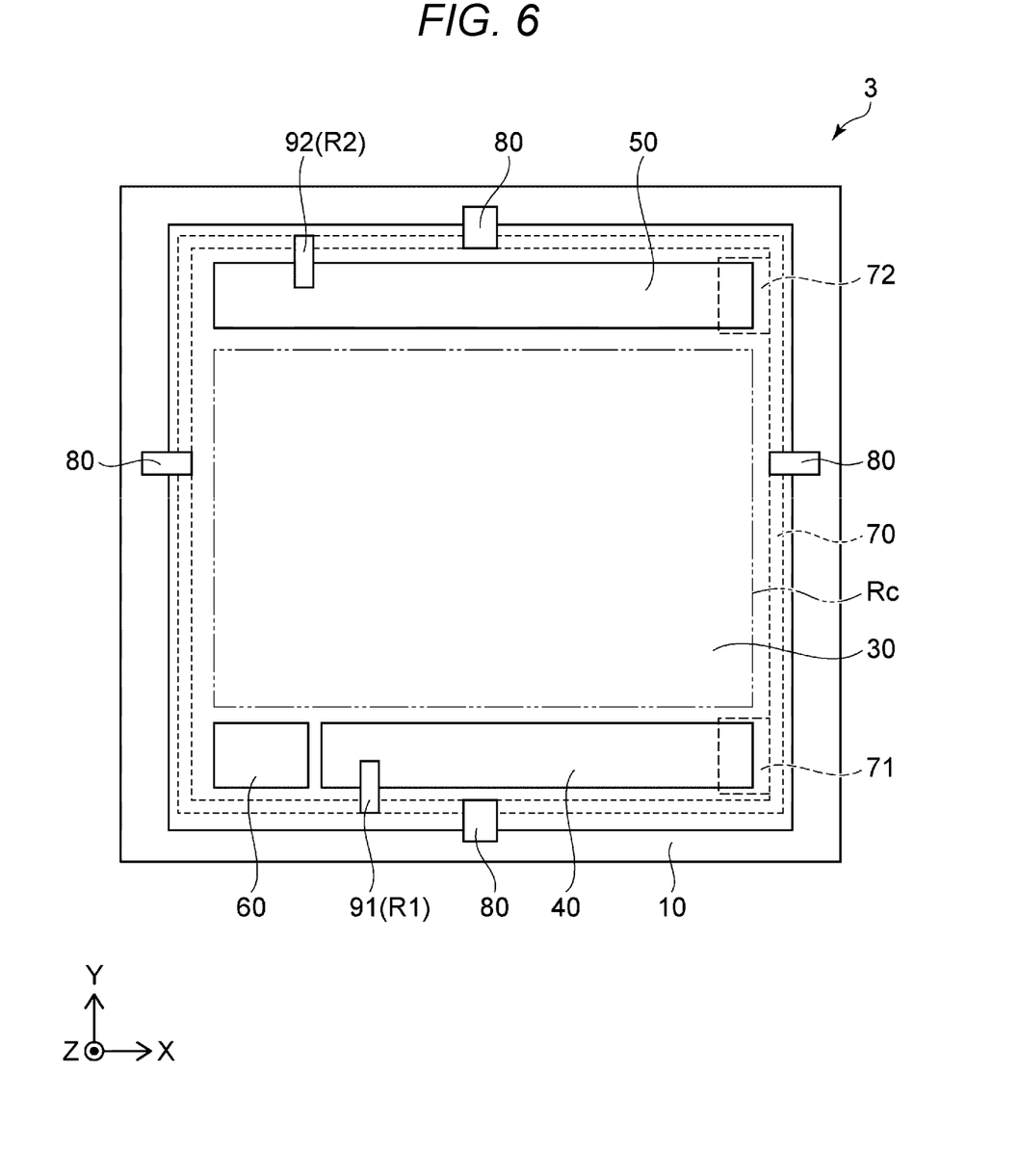
FIG. 6 is a plan view illustrating a nitride semiconductor device according to a third embodiment.
Figure 7:
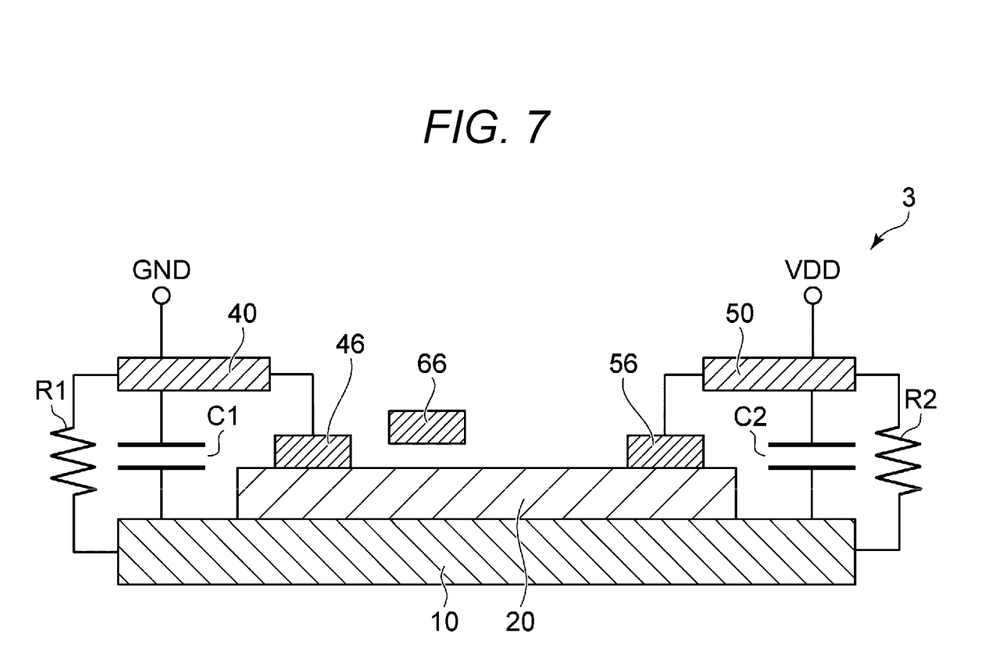
FIG. 7 is a schematic diagram illustrating connection relationships among elements in a nitride semiconductor device according to a third embodiment.

FIG. 6 is a plan view illustrating a nitride semiconductor device 3 according to a third embodiment. FIG. 7 is a schematic diagram illustrating connection relationships among elements in the nitride semiconductor device 3 according to the third embodiment.

As illustrated in FIG. 6, the nitride semiconductor device 3 includes a first resistor 91 and a second resistor 92 in addition to the elements of the nitride semiconductor device 1. The first resistor 91 is connected between the source pad 40 and the guard ring 70. The second resistor 92 is connected between the drain pad 50 and the guard ring 70.

The first resistor 91 and the second resistor 92 are formed from a conductive material higher in resistivity than a material of the guard ring 70, e.g., polysilicon. The first resistor 91 is also referred to as the first resistor R1, and the second resistor 92 is also referred to as the second resistor R2. Preferably, the first resistor R1 has the same resistance value as the second resistor R2. As described above, "equal" refers to equal at design time or in design value, subject to normal variations and tolerances.

As illustrated in FIG. 7, in the nitride semiconductor device 3, the first resistor R1 is thereby connected between the source pad 40 and the substrate 10 in parallel to the first capacitor C1. In addition, the second resistor R2 is connected between the drain pad 50 and the substrate 10 in parallel to the second capacitor C2.

According to the third embodiment, the substrate 10 is capacitively coupled to the source electrode 46 via the first capacitor C1, capacitively coupled to the drain electrode 56 via the second capacitor C2, connected to the source electrode 46 via the first resistor R1, and connected to the drain electrode 56 via the second resistor R2. It is thereby possible to further stabilize the potential of the substrate 10. It is noted that adjusting resistance values of the first resistor R1 and the second resistor R2 enables reduction of a leak current (leakage current) between the source pad 40 and the drain pad 50.

Configurations other than those described above, operations, and effects according to the third embodiment are similar to those according to the first embodiment unless otherwise noted.

Fourth Embodiment

Figure 8:
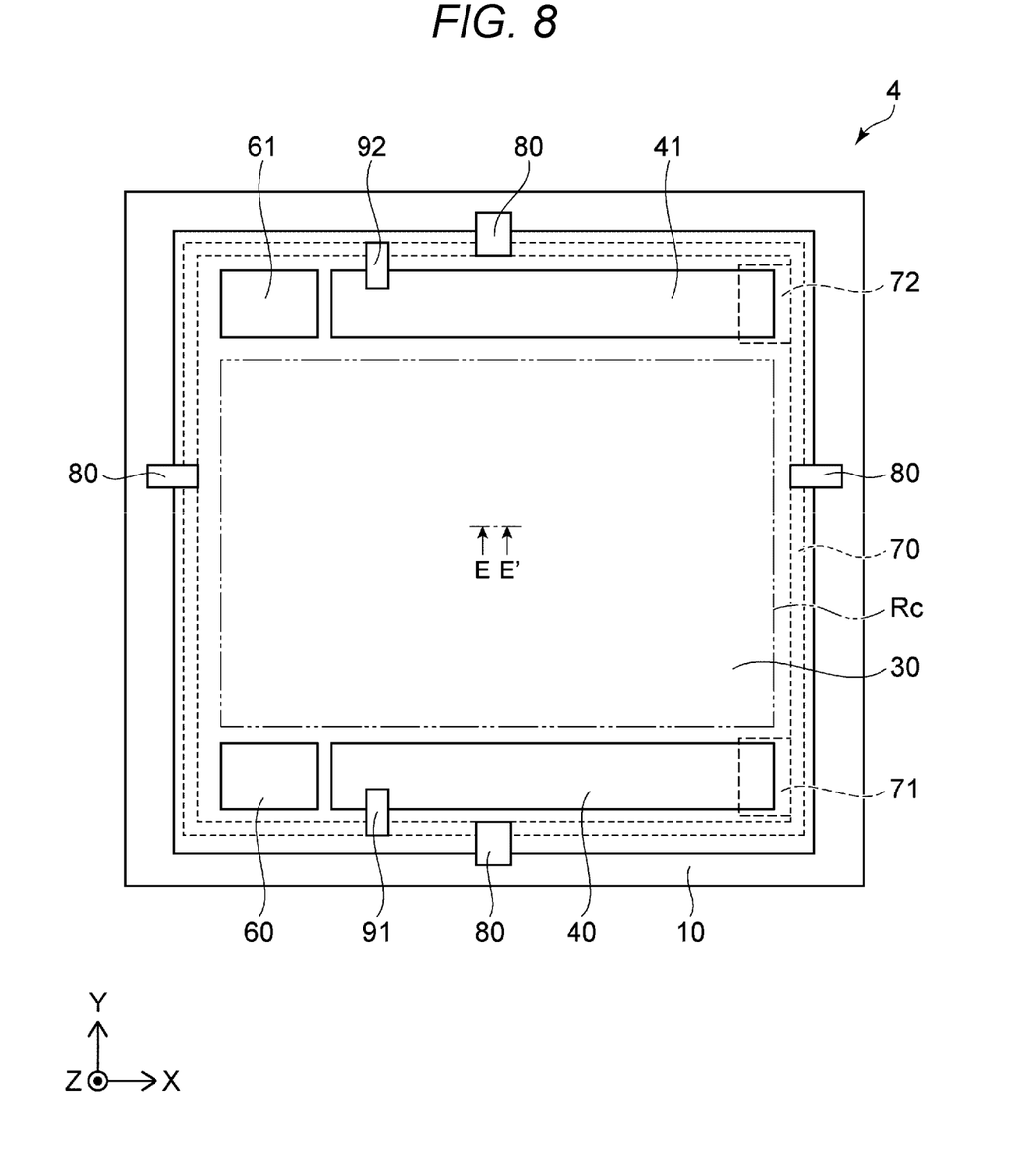
FIG. 8 is a plan view illustrating a nitride semiconductor device according to a fourth embodiment.
Figure 9:
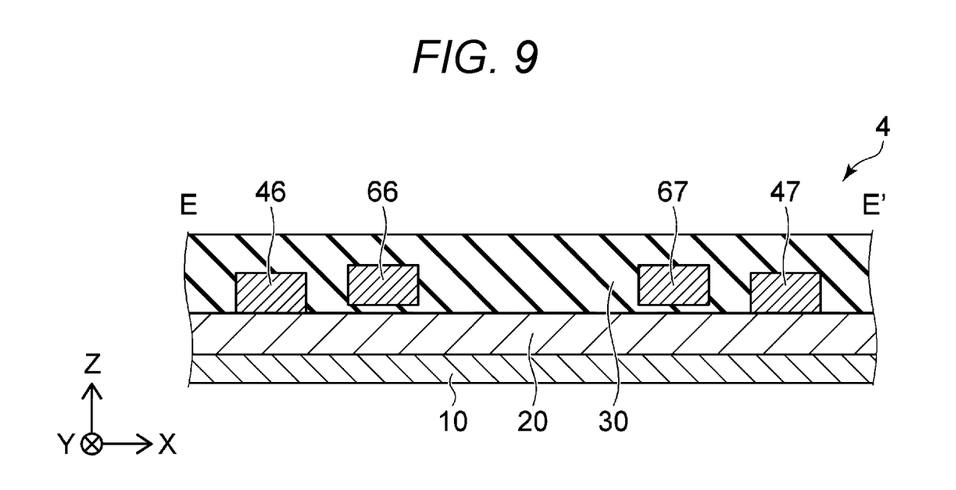
FIG. 9 is a cross-sectional view taken along line E-E' illustrated in FIG. 8.

FIG. 8 is a plan view illustrating a nitride semiconductor device 4 according to a fourth embodiment. FIG. 9 is a cross-sectional view taken along line E-E' illustrated in FIG. 8.

As illustrated in FIGS. 8 and 9, the nitride semiconductor device 4 according to the fourth embodiment includes a gate pad 61 and a gate electrode 67 in addition to the elements of the nitride semiconductor device 3 according to the third embodiment. The gate pad 61 is connected to the gate electrode 67.

In the nitride semiconductor device 4, as compared with the nitride semiconductor device 3, a source pad 41 is in place of the drain pad 50 and a source electrode 47 is provided in place of the drain electrode 56. The source pad 41 is connected to the source electrode 47. In the nitride semiconductor device 4, the second capacitor C2 is formed between the source pad 41 and the second capacitive electrode 72.

As illustrated in FIG. 8, the gate pad 61 and the source pad 41 are arranged along the X direction on the insulating film 30. In addition, as illustrated in FIG. 9, the source electrode 47 comes in contact with the nitride semiconductor layer 20 and the gate electrode 67 is spaced apart from the nitride semiconductor layer 20 by a part of the insulating film 30.

As viewed from above, the gate electrodes 66 and 67 are disposed between the source electrodes 46 and 47. The gate electrode 66 is disposed closer to the source electrode 46 and the gate electrode 67 is disposed closer to the source electrode 47. That is, the gate electrode 66 is disposed between the gate electrode 67 and the source electrode 46, and the gate electrode 67 is disposed between the gate electrode 66 and the source electrode 47.

In the nitride semiconductor device 4, the two gate electrodes 66 and 67 are disposed between the two source electrodes 46 and 47. In addition, the gate electrode 67 controls a current fed from the source electrode 46 to the source electrode 47, while the gate electrode 66 controls a current supplied from the source electrode 47 to the source electrode 46. In this way, the nitride semiconductor device 4 can be used as an integrated two-way switch.

According to the fourth embodiment, the potentials of the substrate 10 and the guard ring 70 can be set to an intermediate potential between potentials of the source electrodes 46 and 47. It is thereby possible to realize substantially the same characteristics whether the current is fed from the source electrode 46 to the source electrode 47 or the current is fed from the source electrode 47 to the source electrode 46. As a result, the stability of operations improves when the nitride semiconductor device 4 is used as the two-way switch.

Configurations other than those described above, operations, and effects according to the present embodiment are similar to those according to the third embodiment unless otherwise noted.

The example of forming the nitride semiconductor layer 20 from GaN or AlGaN is illustrated in each of the embodiments described above. However, the disclosure is not limited to this and other nitride semiconductors may be used.

Furthermore, in other examples, a plurality of guard rings 70, a plurality of first capacitive electrodes 71, and a plurality of second capacitive electrodes 72 may be provided.

The example of forming the first capacitor C1 using the source pad 40 and the first capacitive electrode 71 and forming the second capacitor C2 using the drain pad 50 and the second capacitive electrode 72 is illustrated in each of the embodiments described above. However, methods of forming the first capacitor C1 and the second capacitor C2 are not limited to this and other arrangements for formation of the capacitor C1 and capacitor C2 can be adopted.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A nitride semiconductor device, comprising:
   a conductive substrate;
   a nitride semiconductor layer on the substrate;
   first and second pads disposed above the semiconductor layer and connected to the semiconductor layer;
   first and second electrodes respectively connected to the first and second pads and extending on the semiconductor layer;
   a first control electrode extending between the first and second electrodes; and
   a guard ring disposed on the semiconductor layer, connected to the substrate, and surrounding a region in which the first and second pads, the first and second electrodes and the first control electrode are disposed such that a first capacitor is formed by the guard ring and the first pad and a second capacitor is formed by the guard ring and the second pad.

2. The nitride semiconductor device according to claim 1, further comprising:
   a second control electrode extending between the first control electrode and the first electrode.

3. The nitride semiconductor device according to claim 1, further comprising:
   an insulating film disposed on the semiconductor layer and covering the first and second electrodes, the first control electrode, and the guard ring, wherein
   the first and second pads are disposed on the insulating film.

4. The nitride semiconductor device according to claim 3, further comprising:
   a third electrode connected to the guard ring and facing the first pad across the insulating film to form the first capacitor; and
   a fourth electrode connected to the guard ring and facing the second pad across the insulating film to form the second capacitor.

5. The nitride semiconductor device according to claim 3, further comprising:
   a connection member connecting the guard ring to the substrate and extending along a surface of each of the semiconductor layer and the insulating film.

6. The nitride semiconductor device according to claim 5, further comprising:
   a first opening penetrating the insulating film and through which the connection member is connected to the guard ring.

7. The nitride semiconductor device according to claim 6, further comprising:
   a second opening penetrating the insulating film and the semiconductor layer and through which the connection member is connected to the substrate.

8. The nitride semiconductor device according to claim 1, wherein
   the substrate has a rectangular shape, and an outer edge of the substrate is not covered by the semiconductor layer.

9. The nitride semiconductor device according to claim 1, wherein
   the first and second capacitors have the same capacitance.

10. The nitride semiconductor device according to claim 1, further comprising:
a first resistor connected between the first pad and the guard ring; and
a second resistor connected between the second pad and the guard ring.

11. The nitride semiconductor device according to claim 10, wherein the first and second resistors have the same resistance value.

12. The nitride semiconductor device according to claim 1, wherein
the semiconductor layer contains gallium and nitrogen.

13. The nitride semiconductor device according to claim 1, wherein
the first pad extends along one of sides of the semiconductor layer having a rectangular shape, and
the second pad extends along another side of the semiconductor layer facing said one of sides of the semiconductor layer.

14. The nitride semiconductor device according to claim 13, further comprising:
a third pad connected to the first control electrode and disposed adjacent to the first pad along said one of sides of the semiconductor layer.

15. A nitride semiconductor device, comprising:
a conductive substrate;
a nitride semiconductor layer on the substrate;
first and second pads disposed above the semiconductor layer and connected to the semiconductor layer;
first and second electrodes respectively connected to the first and second pads and extending on the semiconductor layer;
a first control electrode extending between the first and second electrodes;
a guard ring disposed on the semiconductor layer, connected to the substrate, and surrounding a region in which the first and second pads, the first and second electrodes, and the first control electrode are disposed; and
third and fourth electrodes extending from the guard ring into the region and facing the first and second pads.

16. The nitride semiconductor device according to claim 15, further comprising:
an insulating film on the semiconductor layer and covering the first and second electrodes and the first control electrode, wherein
the first and second pads are disposed on the insulating film.

17. The nitride semiconductor device according to claim 16, further comprising:
a connection member connecting the guard ring to the substrate and extending along a surface of each of the semiconductor layer and the insulating film.

18. The nitride semiconductor device according to claim 17, further comprising:
a first opening penetrating the insulating film and through which the connection member is connected to the guard ring.

19. The nitride semiconductor device according to claim 18, further comprising:
a second opening penetrating the insulating film and the semiconductor layer and through which the connection member is connected to the substrate.

20. The nitride semiconductor device according to claim 15, wherein
a first capacitor is formed by the first pad and the third electrode,
a second capacitor is formed by the second pad and the fourth electrode, and
the first and second capacitors have the same capacitance.

* * * * *